United States Patent
Steger et al.

(10) Patent No.: US 11,804,785 B2
(45) Date of Patent: Oct. 31, 2023

(54) POWER ELECTRONIC ARRANGEMENT WITH A MULTI-PHASE POWER SEMICONDUCTOR MODULE

(71) Applicant: SEMIKRON ELEKTRONIK GMBH & CO. KG, Nuremberg (DE)

(72) Inventors: Jürgen Steger, Hiltpoltstein (DE); Andreas Maul, Nuremberg (DE)

(73) Assignee: SEMIKRON ELEKTRONIK GMBH & CO. KG, Nuremberg (DE)

(*) Notice: Subject to any disclaimer, the term of this patent is extended or adjusted under 35 U.S.C. 154(b) by 372 days.

(21) Appl. No.: 17/229,928

(22) Filed: Apr. 14, 2021

(65) Prior Publication Data

US 2021/0336553 A1 Oct. 28, 2021

(30) Foreign Application Priority Data

Apr. 28, 2020 (DE) ...................... 10 2020 111 528.8

(51) Int. Cl.
  *H05K 7/02* (2006.01)
  *H02M 7/00* (2006.01)
  *H01L 25/10* (2006.01)
  *H01L 23/50* (2006.01)

(52) U.S. Cl.
  CPC ............ *H02M 7/003* (2013.01); *H01L 23/50* (2013.01); *H01L 25/105* (2013.01); *H05K 7/02* (2013.01)

(58) Field of Classification Search
  CPC ............................ H05K 7/02; H05K 7/14329
  See application file for complete search history.

(56) References Cited

U.S. PATENT DOCUMENTS

| | | | |
|---|---|---|---|
| 2015/0061112 A1* | 3/2015 | Bogen | H01L 23/3672 257/714 |
| 2018/0061802 A1* | 3/2018 | Beck | H01L 23/473 |
| 2018/0145604 A1* | 5/2018 | Kadota | H01L 25/18 |
| 2018/0254235 A1* | 9/2018 | Tsuyuno | H01L 23/3121 |
| 2019/0019785 A1* | 1/2019 | Nakashima | H01L 23/055 |
| 2020/0020609 A1 | 1/2020 | Yamaura et al. | |
| 2020/0066686 A1* | 2/2020 | Mohn | H02M 7/003 |

FOREIGN PATENT DOCUMENTS

| | | |
|---|---|---|
| DE | 102017115883 A1 | 1/2019 |
| EP | 2 013 626 A2 | 1/2009 |

* cited by examiner

*Primary Examiner* — Sherman Ng
(74) *Attorney, Agent, or Firm* — Andrew F. Young; NOLTE LACKENBACH SIEGEL

(57) ABSTRACT

A power electronic arrangement has a plurality of single-phase power semiconductor modules and one multi-phase power semiconductor module, wherein each single-phase power semiconductor module has a first, at least frame-like housing, two first DC voltage terminal elements, a first AC voltage terminal element, first auxiliary terminal elements and a first switching device. The multi-phase power semiconductor module has a second, at least frame-like housing, two second DC voltage terminal elements, at least two second AC voltage terminal elements, second auxiliary terminal elements and a second switching device. The first and second DC voltage terminal elements each form a stack in a section of their length and on the terminal sections are designed identically. All the power semiconductor modules are arranged in a row in the direction of the normal vectors of the respective first longitudinal side. The first and second DC voltage terminal elements of all power semiconductor modules are arranged on the same, a first, narrow side.

8 Claims, 3 Drawing Sheets

POWER ELECTRONIC ARRANGEMENT WITH A MULTI-PHASE POWER SEMICONDUCTOR MODULE

CROSS REFERENCE TO RELATED APPLICATIONS

This application relates to and claims priority to DE 10 2020 111 528.8 filed Apr. 28, 2020, the entire contents of which are incorporated herein by reference.

FIGURE SELECTED FOR PUBLICATION

FIG. 1

BACKGROUND OF THE INVENTION

Field of the Invention

The invention relates to a power electronic arrangement having a plurality of single-phase power semiconductor modules and a multi-phase power semiconductor module, as well as a multi-phase power semiconductor module of such a kind. This arrangement is designed to supply two AC power consumers having different power ratings in vehicles that are either partially or completely electrically powered. Examples of these include all-wheel drive systems with a "strong" and a "weak" electric motor, or drive systems with an electric motor and another two- or multi-phase AC power consumer, such as a rectifier.

Description of the Related Art

Document DE 10 2017 115 883 A1 discloses a sub-module and an arrangement therewith, wherein the sub-module comprises a switching device with a substrate and conductor tracks arranged thereon. The sub-module comprises a first and a second DC voltage conductor track and a first and a second DC voltage terminal element electrically connected thereto, as well as an AC voltage conductor track and an AC voltage terminal element electrically connected thereto. The sub-module further comprises a shaped insulator body, which encloses the switching device in a frame-like manner. In this case, the first DC voltage terminal element rests with a first contact section on a first contact body of the shaped insulator body, the AC voltage terminal element rests with a second contact section on a second contact body of the shaped insulator body. A first clamping device is designed to extend through a first opening of the first contact body in an electrically insulated manner and to form an electrically conductive clamped connection between the first DC voltage terminal element and an associated first DC voltage connection element, and a second clamping device is designed to extend through a second opening of the second contact body in an electrically insulated manner and to form an electrically conductive clamped connection between the AC voltage terminal element and an associated AC voltage connection element.

ASPECTS AND SUMMARY OF THE INVENTION

Having regard to the aforementioned prior art, the object of the invention is to present a power electronic arrangement having a plurality of single-phase power semiconductor modules and one multi-phase power semiconductor module, as well as a multi-phase power semiconductor module of this kind, wherein this arrangement permits a simple DC voltage supply for all the power semiconductor modules and is prepared to supply two AC power consumers that have different power ratings.

This object is achieved according to the invention by a power electronic arrangement having a plurality of single-phase power semiconductor modules and one multi-phase power semiconductor module, wherein each single-phase power semiconductor module has a first, at least frame-like housing, two first DC voltage terminal elements, a first AC voltage terminal element, first auxiliary terminal elements and a first switching device, wherein the multi-phase power semiconductor module has a second, at least frame-like housing, two second DC voltage terminal elements, at least two second AC voltage terminal elements, second auxiliary terminal elements and a second switching device, wherein the first and second DC voltage terminal elements each form a stack in a section of their length and on the terminal sections and are designed identically, wherein all the power semiconductor modules are arranged in a row in the direction of the normal vectors of their respective first longitudinal sides and wherein the first and second DC voltage terminal elements of all power semiconductor modules are arranged on the same, the first, narrow side. In this case, the first and second longitudinal sides of adjacent power semi-conductor modules, which are opposite one another in each case, can touch each other or be spaced apart from each other.

A first AC power consumer is preferably connected to the first AC voltage terminal elements, while a second AC power consumer of lower power is preferably connected to the second AC voltage terminal elements. It is particularly advantageous here if the first and second AC voltage terminal elements of all power semiconductor modules are arranged on the same, the second, narrow side.

It is preferable if the first and second DC voltage terminal elements are designed identically, at least in the region of the terminal sections. Thus, the first and second power semi-conductor modules are identical in terms of their DC voltage terminal elements. In particular, but not exclusively in the context of this embodiment, it is advantageous if all DC voltage terminal elements are connected to common DC voltage supply elements with the correct polarity, which means that in addition to the first power semiconductor modules, the second power semiconductor module can also be supplied from the same DC voltage source and with little additional constructive effort.

It can also be advantageous if the auxiliary terminal elements of all power semiconductor modules are arranged along one or both longitudinal sides of the respective power semiconductor module.

It may also be preferable if all the power semiconductor modules have a centrally positioned mounting opening.

In particular, it is advantageous if all the power semiconductor modules have a common driver device 6. In this case, each of the power semiconductor modules can be at least partially covered by the driver device. All the power semiconductor modules are then advantageously connected to this driver device by means of their auxiliary terminal elements.

The object is additionally achieved by a multi-phase power semiconductor module 4 having a second, at least frame-like housing, two second DC voltage terminal elements, at least two second AC voltage terminal elements, second auxiliary terminal elements and a second switching device, wherein the first and second DC voltage terminal elements each form a stack in a section of their length and on the terminal sections, the second DC voltage terminal elements are arranged on a first narrow side and the second AC voltage terminal elements are arranged on a second narrow side, next to one another in the normal direction.

It can also be advantageous if the second auxiliary terminal elements are arranged along a long side or, of course, along both long sides.

It may be advantageous if the second AC voltage terminal elements are designed as a metal foil or metal sheet, with a thickness of preferably 300 µm to 2000 µm, particularly preferably of 500 µm to 1500 µm. It is additionally preferable if the first AC voltage terminal elements are also designed in the same way, as is the case for the first and second DC voltage terminal elements.

In general, it is advantageous if the housing has a plurality of contact regions on its second narrow side, for each of the associated terminal regions of the second AC voltage terminal elements. In this case, it is additionally advantageous if the respective contact region and the associated AC voltage terminal element each have a continuous opening, wherein these openings are aligned with one another. It is additionally advantageous in this case if the openings are designed and provided to accommodate sections of pressure elements that are designed to press the respective AC voltage terminal element onto the associated contact region and to press the housing section of the contact region against a cooling device.

Of course, provided that this is not inherently or explicitly excluded, the features mentioned in the singular, in particular the multi-phase power semiconductor module, may also be present more than once in the arrangement according to the invention.

It goes without saying that the various embodiments of the invention can be implemented either individually or in any combination, in order to achieve improvements. In particular, the features mentioned and explained above and hereafter can be used not only in the combinations indicated but also in other combinations or by themselves, without departing from the scope of the present invention and regardless of whether they are disclosed in the context of the arrangement or the multi-phase power semiconductor module.

Further explanations of the invention, advantageous details and features are evident from the following description of the exemplary embodiments of the invention illustrated schematically in FIGS. 1 to 4, or from respective parts thereof.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
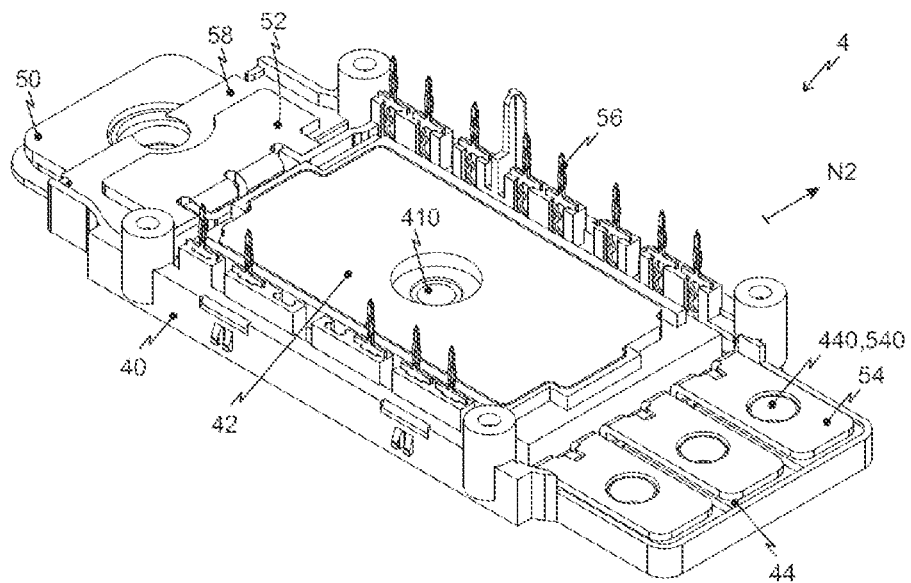
FIG. 1 shows a multi-phase power semiconductor module according to the invention in a three-dimensional view.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIG. 1 shows a multi-phase power semiconductor module according to the invention in a three-dimensional view. This multi-phase power semiconductor module has a frame-like second housing 40 with a housing cover 42. A second switching device, which is essentially of standard design, is arranged inside the multi-phase power semiconductor module. This is designed, purely by way of example, as a three-phase bridge circuit and is intended to generate a three-phase AC output voltage from a DC input voltage.

Figure 2:
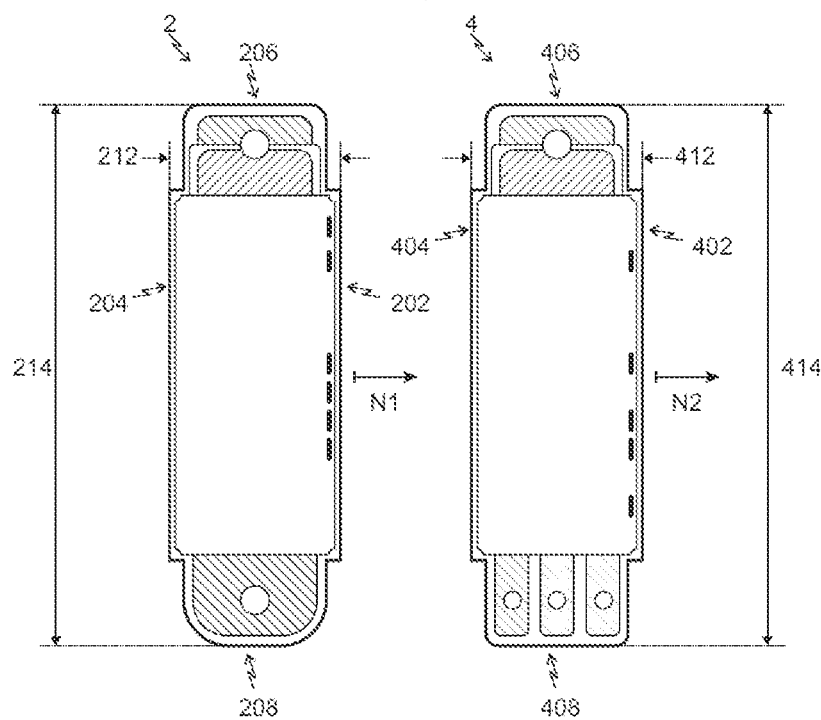
FIG. 2 shows a detail of an arrangement according to the invention in plan view.

For this purpose, the multi-phase power semiconductor module has two second DC voltage terminal elements 50, 52 on its first narrow side 406, cf. also FIG. 2. These are each formed as flat, shaped metal bodies produced by stamping-bending techniques. The two second DC voltage terminal elements 50, 52 each form a stack in substantial sections of their length, extending into the region of the terminal sections. There, the two contact surfaces that protrude upwards, as in the standard single-phase power semiconductor module according to FIG. 4, are offset relative to each other. Thus, an extremely low-inductance connection to associated DC voltage supply elements is possible, cf. FIG. 3. To connect the second DC voltage terminal elements 50, 52 to the associated DC voltage supply elements with the correct polarity, both the DC voltage terminal elements 50, 52 and the DC voltage supply elements, as well as the housing, each have a continuous opening, all of which are aligned with each other. These openings are designed for and suitable for receiving a section of an electrically insulated screw connection.

On the second narrow side 408 of the housing 40 opposite the first narrow side 406, a plurality of contact regions 44 are arranged next to one another in the normal direction N2, cf. also FIG. 2. In this embodiment, a second AC voltage terminal element 54 is arranged on each of the contact regions 44. In the case of switching devices with only two AC voltage terminal elements 54, the central contact surface is preferably kept free.

Figure 3:
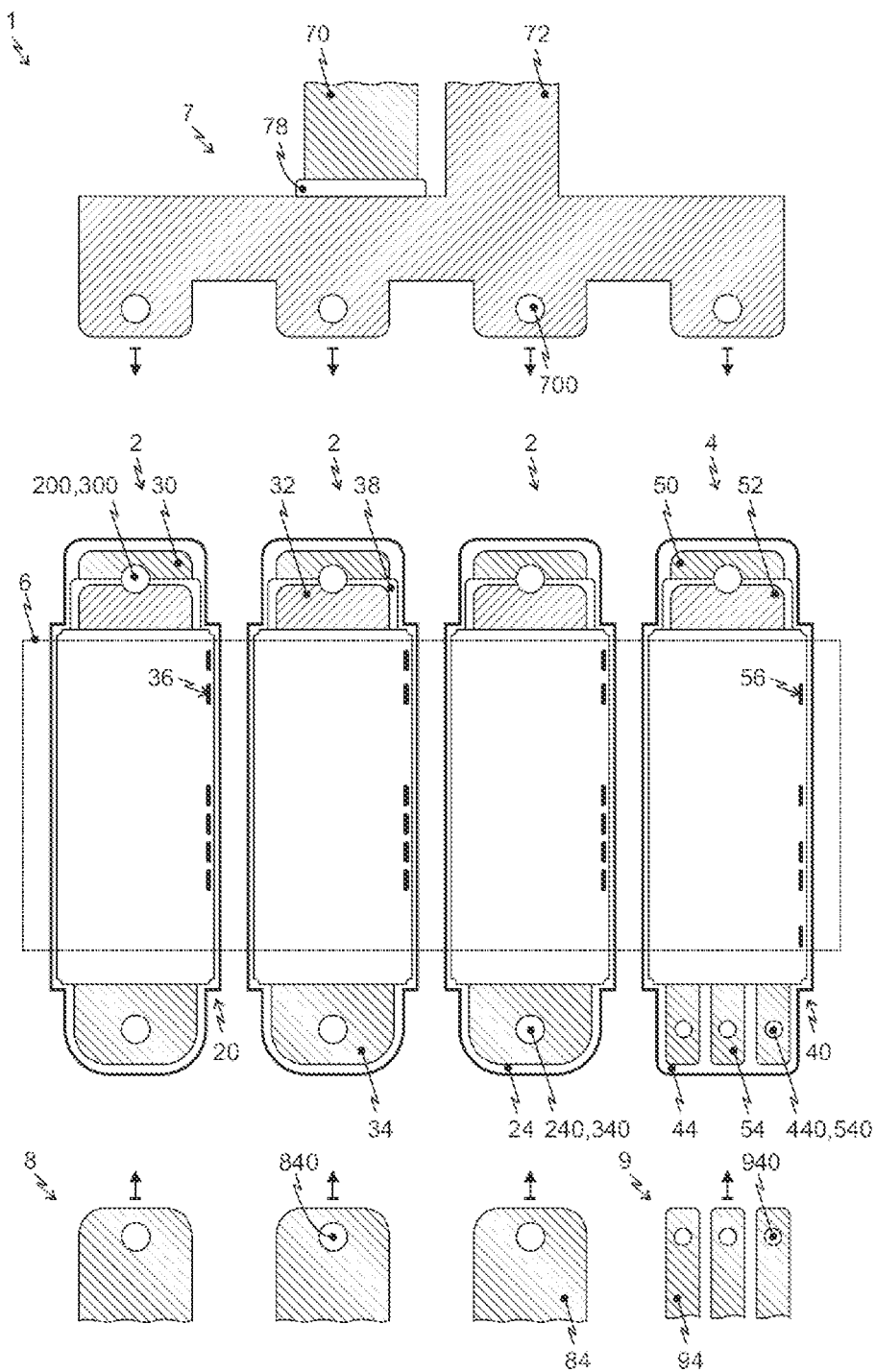
FIG. 3 shows an arrangement according to the invention.
Figure 4:
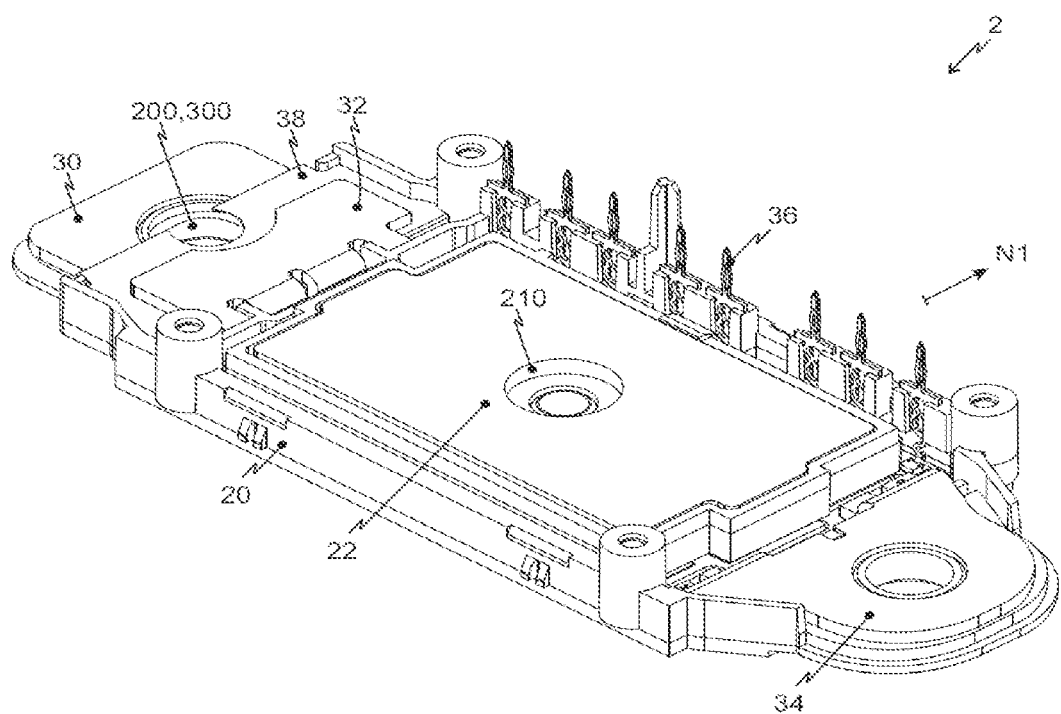
FIG. 4 shows a single-phase power semiconductor module according to the prior art in a three-dimensional view.

Both the respective contact region 44 of the housing 40 and the associated AC voltage terminal element 54, as well as second AC voltage supply elements 94 to be arranged here, cf. FIG. 3, each have continuous openings 440, 540, 940 aligned with one another (cf. FIG. 3). These openings are designed for and suitable for receiving a section of a preferably electrically insulated screw connection.

Furthermore, the multi-phase power semiconductor module 4 has a plurality of second auxiliary terminal elements 56, which are arranged near the edge of both longitudinal sides 402, 404 and are designed here as press-pin terminal elements.

In addition, the multi-phase power semiconductor module 4, similarly to the single-phase power semiconductor module according to FIG. 4, has a centrally positioned mounting opening 410, which is designed and intended to fix the respective power semiconductor module on a cooling device in a thermally conductive manner.

FIG. 2 shows a detail of an arrangement according to the invention in plan view, in particular for determining geometric parameters, while FIG. 3 shows an arrangement according to the invention with additional components. Each of the power semiconductor modules 2,4 has an essentially rectangular outline within each case a first and a second narrow side 206, 208, 406, 408 opposite the first, with a first long side 202,402 having a normal vector N1, N2 and a second long side 204, 404 opposite this first long side. All the power semiconductor modules 2,4 have the same length 214, 414 and preferably also, as shown here, the same width 212,412.

The power electronic arrangement 1 according to the invention shown in FIG. 3 comprises three single-phase power semiconductor modules 2 arranged in a row, and a multi-phase power semiconductor module 4 which continues the row. Here, the normal vectors N1, N2 of all first longitudinal sides 202, 402 (see FIG. 2) point in the same direction.

Each of the single-phase power semiconductor modules 2 comprises, cf. also FIG. 4, a frame-like first housing 20 with a cover 22, two first DC voltage terminal elements 30, 32, a first AC voltage terminal element 34, first auxiliary terminal elements 36, and a first switching device.

The multi-phase power semiconductor module 4 in accordance with FIG. 1 comprises a frame-like second housing 40 with a cover 42, two second DC voltage terminal elements 50,52, at least two second AC voltage terminal elements 54, second auxiliary terminal elements 56, and a second switching device 502.

It is essential that the first and second DC voltage terminal elements 30, 32, 50, 52 each form a stack in a section of their length and on the terminal sections and are designed in the same way, in this case even identically, so that they can be easily connected to identical DC voltage supply elements 70, 72.

In this case the first and second DC voltage terminal elements 30, 32, 50, 52 of all the power semiconductor modules 2, 4 are arranged on the same, the first, narrow side 206, 406.

In addition, and for reasons of clarity shown at a distance from the power semiconductor modules 2, 4, are DC voltage supply elements 70, 72 that form a stack, which here form the DC voltage supply lead 7 of a capacitor device, not shown. These DC voltage supply elements 70, 72 are connected with the correct polarity to all DC voltage terminal elements 30, 32, 50, 52, i.e., both to those of the single-phase power semiconductor modules 2 and to those of the multi-phase power semiconductor module 4. Precisely in order to allow the simple connection of all DC voltage terminal elements 30, 32, 50, 52, in all power semiconductor modules these are designed identically, at least in the terminal region.

Of course, to provide electrical insulation between the elements of different polarity, both the DC voltage terminal elements 30, 32, 50, 52 and the DC voltage supply elements 70, 72 have an intermediate insulation layer 38, 58, 78.

Furthermore, both the respective housing 2,4, as well as the DC voltage terminal elements 30, 32, 50, 52 and here also the DC voltage supply elements 70, 72, have openings 200, 300, 700, which are designed and provided to accommodate sections of pressure elements, which are designed to press the respective stack of DC voltage supply elements 70, 72 onto the stack of DC voltage terminal elements 30, 32, 50, 52 and to press these onto associated contact regions of the housing 20, 40.

The single-phase power semiconductor modules 2 each have a first AC voltage terminal element 34, which is provided and designed to be connected to a first AC voltage supply lead 8, which has three AC voltage supply elements 84. For reasons of clarity, these AC voltage supply elements 84 are also shown a distance away from the associated single-phase power semiconductor modules 2 and here form the terminal of a first three-phase electric motor.

The multi-phase power semiconductor module 4 have three second AC voltage terminal elements 54, which are provided and designed to be connected to a second AC voltage supply lead 9 which has three AC voltage supply elements 94. For reasons of clarity, these AC voltage supply elements 94 are also shown a distance away from the associated multi-phase power semiconductor modules 4 and here form the terminal of a second three-phase electric motor. This second three-phase electric motor has a lower power rating than the first.

Furthermore, both the respective housing 20, 40 as well as the AC voltage terminal elements 34, 54, and here also the AC voltage supply elements 84,94, have openings 240, 340, 840, 940, which are designed and provided to accommodate sections of pressure elements which are designed to press the respective AC voltage supply element 84, 94 onto the associated AC voltage terminal element 34,54 and to press these onto associated contact regions 44 of the housing 20, 40.

All of the first and second AC voltage terminal elements 34, 54 of all power semiconductor modules are arranged on the same, the second, narrow side 206, 406 of the respective power semiconductor modules 2, 4. Thus, the arrangement according to the invention has all DC voltage terminal elements 30, 32, 50, 52 along the first narrow sides 206, 406 and all AC voltage terminal elements 34, 54 on the second narrow side 208, 408. This enables a very efficient and compact design and also enables very low inductances on the DC voltage side.

Each power semiconductor module 2,4 also comprises auxiliary terminal elements 36, 56 arranged along one or both longitudinal sides 202, 204, 402, 404 of the respective power semiconductor modules 2, 4. These auxiliary terminal elements 36, 56 are used to provide the electrically conductive connection to a driver device 6 common to all power semiconductor modules 2, 4. This covers, in each case partially, all the power semiconductor modules 2, 4.

FIG. 4 shows a single-phase power semiconductor module 2 according to the prior art in a three-dimensional view. This single-phase power semiconductor module 2 has a frame-like second housing 20 with a housing cover 22. A first switching device, which is essentially of standard design, is arranged inside the single-phase power semiconductor module 2. This is designed, purely by way of example, as a single-phase bridge circuit and is intended to generate a single-phase AC output voltage from a DC input voltage.

For this purpose, the single-phase power semiconductor module 2 has two first DC voltage terminal elements 30, 32 on its first narrow side 206. These are identical to those of the multi-phase power semiconductor module according to FIG. 1. On the second narrow side 208 of the housing 20, opposite the first narrow side 206, a first AC voltage terminal element 34 is arranged.

Furthermore, the single-phase power semiconductor module 2 has a plurality of first auxiliary terminal elements 36, which are arranged near the edge of the first longitudinal side 204 and are designed here as press-pin terminal elements.

In addition, the single-phase power semiconductor module 2, similarly to the multi-phase power semiconductor module according to FIG. 1, has a centrally positioned mounting opening 210, which is designed and intended to fix the respective power semiconductor module on a cooling device in a thermally conductive manner.

It is to be noted that of course features of different exemplary embodiments of the invention can be combined with one another in an arbitrary manner, unless the features are mutually exclusive, without departing from the scope of the invention.

Also, the inventors intend that only those claims which use the specific and exact phrase "means for" are intended to be interpreted under 35 USC 112, sixth paragraph. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

The invention claimed is:

1. A power electronic arrangement, comprises:
    a plurality of single-phase power semiconductor modules and one multi-phase power semiconductor module;
    each said single-phase power semiconductor module has a first, at least frame-like, housing, two first DC voltage terminal elements, a first AC voltage terminal element, first auxiliary terminal elements and a first switching device;
    the multi-phase power semiconductor module has a second, at least frame-like, housing, two second DC voltage terminal elements, at least two second AC voltage terminal elements, second auxiliary terminal elements, and a second switching device;
    the first and the second DC voltage terminal elements respectively each form a stack in a section of their length and on respective terminal sections and are designed identically;
    wherein all said single-phase power semiconductor modules and said multi-phase power semiconductor module are arranged in a row in the direction of the normal vectors (N1, N2) of their respective first longitudinal sides; and
    wherein the first and the second DC voltage terminal elements of all power semiconductor modules are arranged on the same, the first, narrow side.

2. The power electronic arrangement, according to claim 1, wherein:
    the first and the second DC voltage terminal elements are designed identically in the region of the terminal sections.

3. The power electronic arrangement, according to claim 2, wherein:
    each said first and said second DC voltage terminal element is connected to respective common DC voltage supply elements with the correct polarity.

4. The power electronic arrangement, according to claim 3, wherein:
    the first and the second AC voltage terminal elements of each said power semiconductor module are arranged on the same, a second, narrow side.

5. The power electronic arrangement, according to claim 4, wherein:
    the first and the second auxiliary terminal elements of all power semiconductor modules are arranged along one or both longitudinal sides of the respective power semiconductor module.

6. The power electronic arrangement, according to claim 5, wherein:
    each said power semiconductor module has a centrally arranged mounting opening.

7. The power electronic arrangement, according to claim 6, wherein:
    each said power semiconductor module has a common driver device.

8. The power electronic arrangement, according to claim 7, wherein:
    each of the power semiconductor modules is at least partially covered by the driver device.

\* \* \* \* \*